(12) United States Patent
Shin et al.

(10) Patent No.: US 12,721,185 B2
(45) Date of Patent: Aug. 25, 2026

(54) SEMICONDUCTOR DEVICE AND METHOD OF MAKING FACE-UP WAFER-LEVEL PACKAGE USING INTENSIVE PULSED LIGHT IRRADIATION

(71) Applicant: STATS ChipPAC Pte. Ltd., Singapore (SG)

(72) Inventors: YongMoo Shin, Jung-gu (KR); HeeSoo Lee, Incheon (KR); SeungHyun Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 369 days.

(21) Appl. No.: 18/459,777

(22) Filed: Sep. 1, 2023

(65) Prior Publication Data

US 2025/0079380 A1 Mar. 6, 2025

(51) Int. Cl.
*H10W 70/09* (2026.01)
*H10W 70/60* (2026.01)
(Continued)

(52) U.S. Cl.
CPC .......... *H10W 70/09* (2026.01); *H10W 70/60* (2026.01); *H10W 70/6528* (2026.01);
(Continued)

(58) Field of Classification Search
CPC ................ H01B 13/003; H10F 71/134; H05H 2007/007; H01L 24/02; H01L 24/03; H01L 24/18–20; H01L 2224/11505; H01L 21/823475; H01L 21/823871; H01L 21/76895; H01L 21/76897; H01L 21/76804; H01L 21/76805; H01L 21/76816; H01L 21/76877; H01L 21/268; H01L 21/67115; H01L 23/5226;
(Continued)

(56) References Cited

U.S. PATENT DOCUMENTS 7,276,783 B2 10/2007 Goller et al.
8,361,842 B2 * 1/2013 Yu .......................... H01L 24/96 438/126
(Continued)

FOREIGN PATENT DOCUMENTS

KR 10-2012-0132424 A 12/2012
KR 10-1465616 B1 11/2014
(Continued)

OTHER PUBLICATIONS

English Translation of Chen (Year: 2018).*
(Continued)

*Primary Examiner* — Wael M Fahmy
*Assistant Examiner* — Thomas Wilson McCoy
(74) *Attorney, Agent, or Firm* — Brian M. Kaufman; Robert D. Atkins; PATENT LAW GROUP: Atkins and Associates, P.C.

(57) ABSTRACT

A semiconductor device has a carrier. An electrical component is disposed over the carrier. An encapsulant is deposited over the electrical component. A conductive layer is formed over the encapsulant. The conductive layer is deposited as a plurality of graphene-coated metal balls in a matrix. The conductive layer is sintered by intensive pulsed light (IPL) irradiation.

24 Claims, 15 Drawing Sheets

(51) Int. Cl.
*H10W 70/652* (2026.01)
*H10W 72/00* (2026.01)
*H10W 74/01* (2026.01)
*H10W 74/10* (2026.01)

(52) U.S. Cl.
CPC ...... *H10W 72/0198* (2026.01); *H10W 74/019* (2026.01); *H10W 74/141* (2026.01); *H10W 74/142* (2026.01)

(58) Field of Classification Search
CPC ............. H01L 23/5283; H01L 23/5286; H01L 23/528; H01L 23/481; H01L 23/535; H01L 23/5384; H01L 23/5386; H01L 23/49877; H01L 23/3128; H01L 23/49816; H10W 74/117; H10W 90/701; H10W 20/068; H10W 20/069; H10W 20/082; H10W 20/083; H10W 20/089; H10W 20/056; H10W 20/42; H10W 20/435; H10W 20/427; H10W 20/43; H10W 20/20; H10W 70/60; H10W 70/611; H10W 70/635; H10W 70/65; H10W 70/09; H10W 70/6528; H10W 72/012; H10W 72/0198; H10W 74/141; H10W 74/10; H10W 74/019; H10W 74/142; H10D 84/0149; H10D 84/038; H10D 84/0186; H05K 2201/10734; H05K 3/3436
See application file for complete search history.

(56) References Cited

U.S. PATENT DOCUMENTS

| | | | | |
|---|---|---|---|---|
| 8,535,553 | B2 | 9/2013 | Kong et al. | |
| 9,305,854 | B2 | 4/2016 | Shim et al. | |
| 2011/0097850 | A1* | 4/2011 | Hsu | H01L 21/561 257/E21.599 |
| 2014/0124950 | A1* | 5/2014 | Fang | H01L 23/49822 257/774 |
| 2015/0155248 | A1* | 6/2015 | Lin | H01L 24/11 257/737 |
| 2015/0179602 | A1 | 6/2015 | Camacho et al. | |
| 2016/0064309 | A1* | 3/2016 | Su | H01L 23/49816 257/773 |
| 2017/0221819 | A1* | 8/2017 | Chu | H10D 1/68 |
| 2021/0193686 | A1* | 6/2021 | You | G02F 1/13452 |
| 2021/0384142 | A1* | 12/2021 | Chang | H10W 40/778 |
| 2024/0128230 | A1* | 4/2024 | Lee | H01L 24/13 |
| 2025/0022792 | A1* | 1/2025 | Shin | H01L 23/49816 |

FOREIGN PATENT DOCUMENTS

| | | | | |
|---|---|---|---|---|
| KR | 10-1895114 B1 | | 8/2018 | |
| WO | WO-2018152907 A1 | * | 8/2018 | H10D 86/00 |

OTHER PUBLICATIONS

Shin, YongMoo, STATS ChipPAC Pte. Ltd., "Semiconductor Device and Method of Forming RDL with Graphene-Coated Core" U.S. Appl. No. 18/150,567, filed Jan. 5, 2023.

* cited by examiner

SEMICONDUCTOR DEVICE AND METHOD OF MAKING FACE-UP WAFER-LEVEL PACKAGE USING INTENSIVE PULSED LIGHT IRRADIATION

FIELD OF THE INVENTION

The present invention relates in general to semiconductor devices and, more particularly, to a semiconductor device and method of making a face-up wafer-level package using intensive pulsed light irradiation.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor device manufacturers are continually striving to make smaller semiconductor devices to meet the demands of electronic device manufacturers and consumers alike. As the density of components within semiconductor packages increases, the redistribution layers (RDL) used in semiconductor packages must have smaller pitches between conductors. The smaller pitches increase vulnerability of the RDL to insulation failure, which can result in short circuits between adjacent conductive traces. One major issue that causes short circuits is ion migration from one conductive trace that can extend through the adjacent insulating layers and eventually reach another conductive trace. Therefore, a need exists for semiconductor manufacturing methods and semiconductor devices that are less susceptible to ion migration.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are formed into semiconductor packages that include pins or contact pads for interconnection with other system components. An encapsulant or other molding material is deposited over the semiconductor package to provide physical support and electrical isolation. The finished semiconductor package is then inserted into an electrical system and the functionality of the semiconductor device is made available to the other system components. Contact pads formed over the semiconductor die are connected to contact pads of the external electrical system by the semiconductor package and another electrical connection type. The electrical connections can be made with conductive layers, bumps, stud bumps, conductive paste, or wirebonds.

Figure 1A:
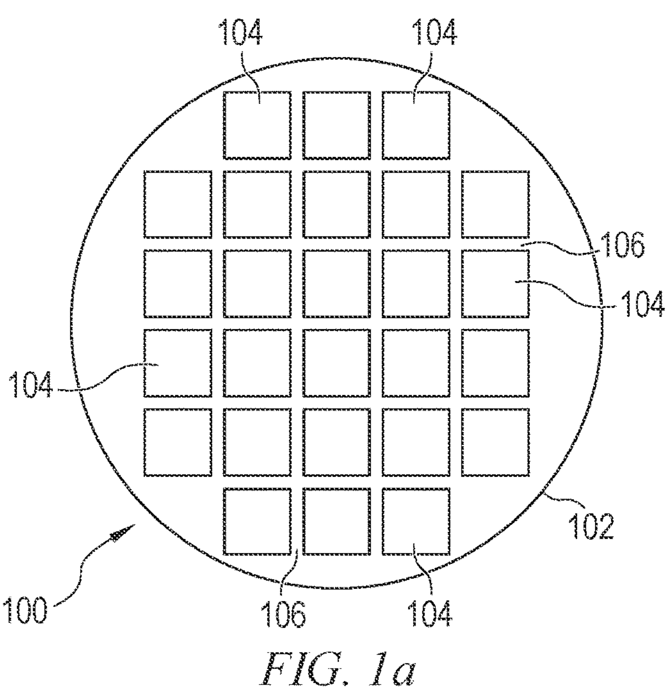
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
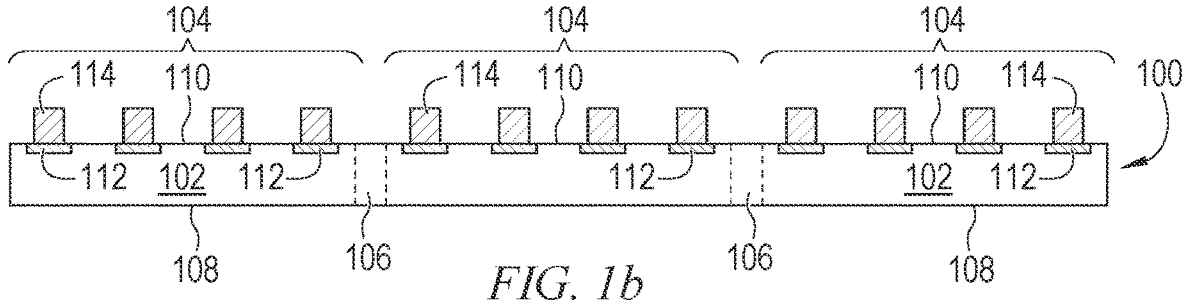

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed over or within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuit (ASIC), memory, power device, or other signal processing circuit. Semiconductor die 104 may also contain integrated passive devices (IPDs), such as inductors, capacitors, and resistors, for RF signal processing.

An electrically conductive layer 112 is formed over active surface 110 using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive pillars 114 are formed on contact pads 112. Conductive pillars 114 can be formed of similar materials and using similar methods as taught for contact pads 112. In some embodiments, a photoresist layer is formed over active surface 110 and conductive pillars 114 are formed by depositing or sputtering conductive material into openings of the photoresist layer. In one embodiment, conductive pillars 114 are simply formed as part of conductive layer 112 by making the contact pads taller. In some embodiments, conductive pillars 114 are not formed, and the below illustrated steps occur directly on active surface 110 and contact pads 112 without the vertical offset provided by conductive pillars 114.

Figure 1C:
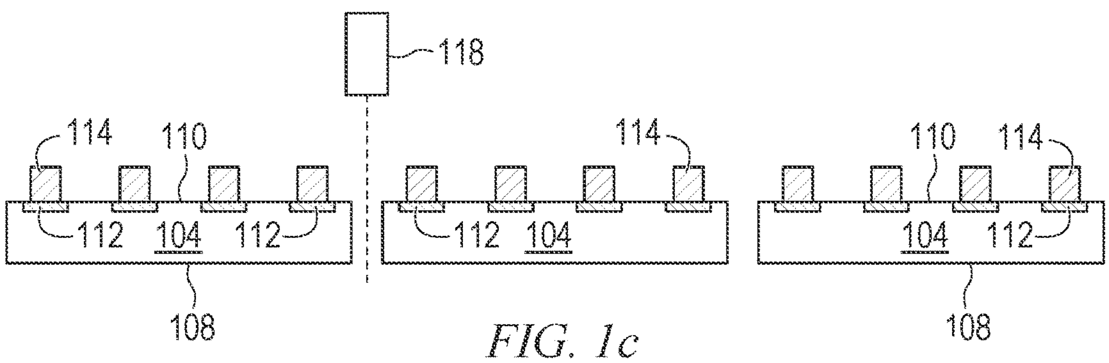

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die (KGD) or known good unit (KGU) after singulation.

Figure 2A:
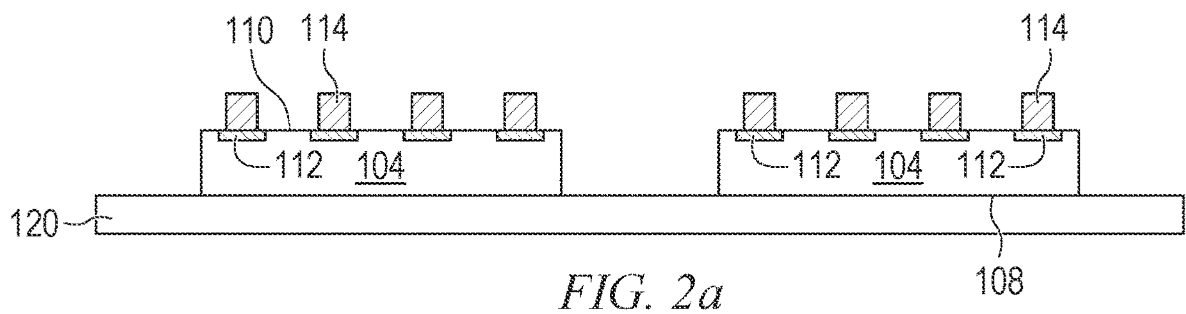
FIGS. 2*a*-2*q* illustrate a process of forming a semiconductor package with a graphene-based redistribution layer sintered by intensive pulsed light irradiation.
Figure 2B:
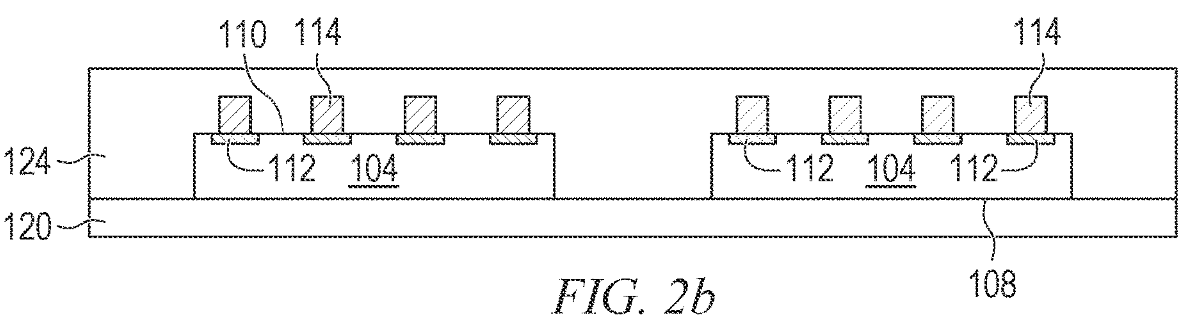
Figure 2C:
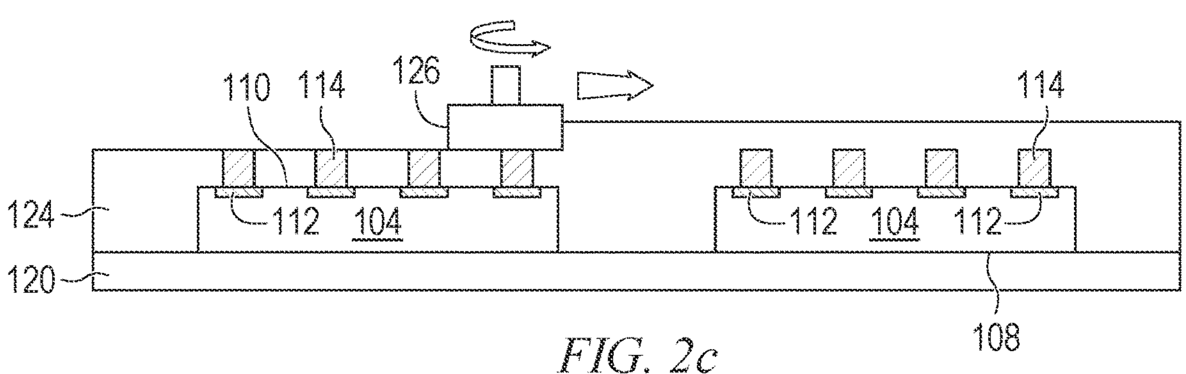
Figure 2D:
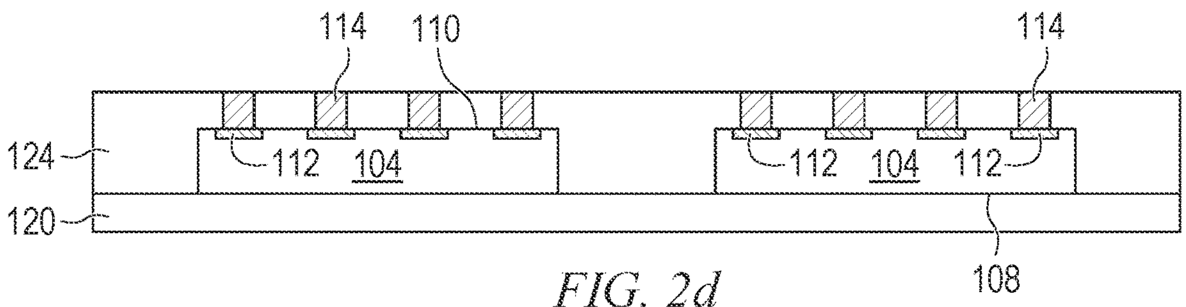
Figure 2E:
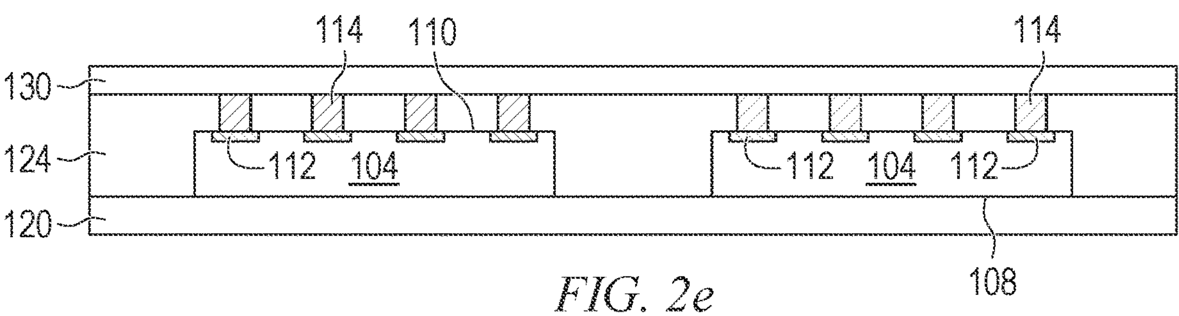
Figure 2F:
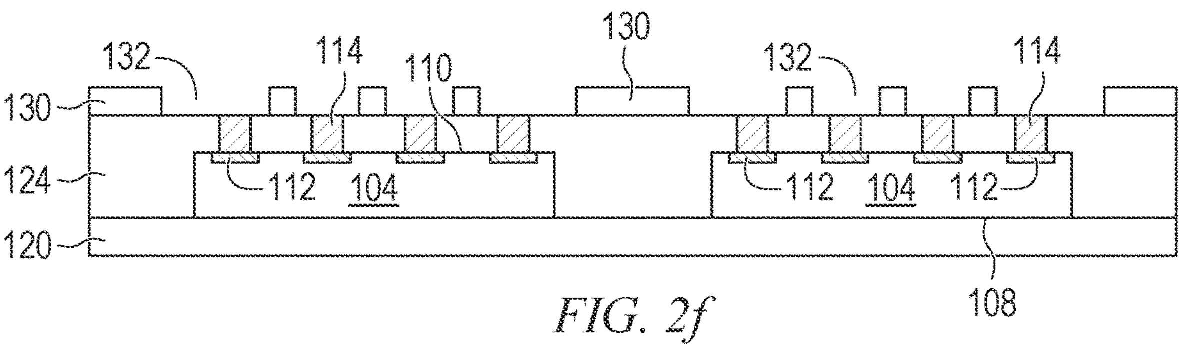
Figure 2G:
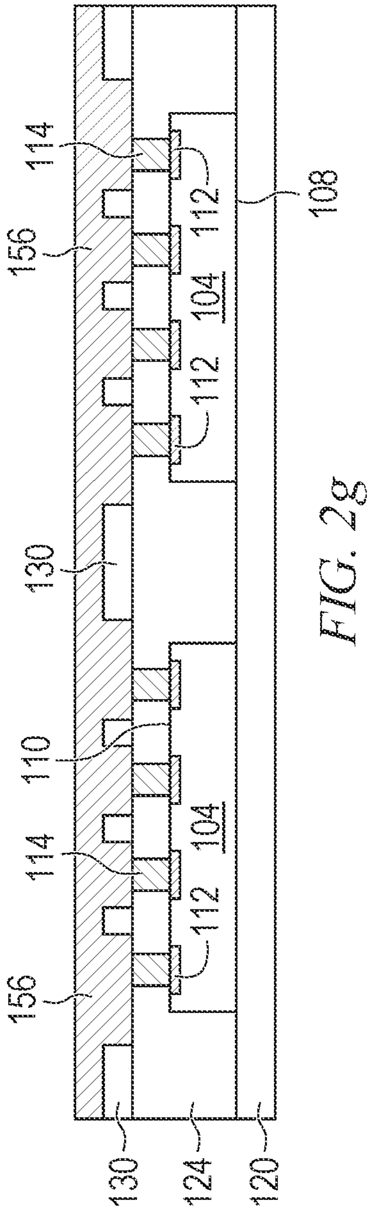
Figure 2H:
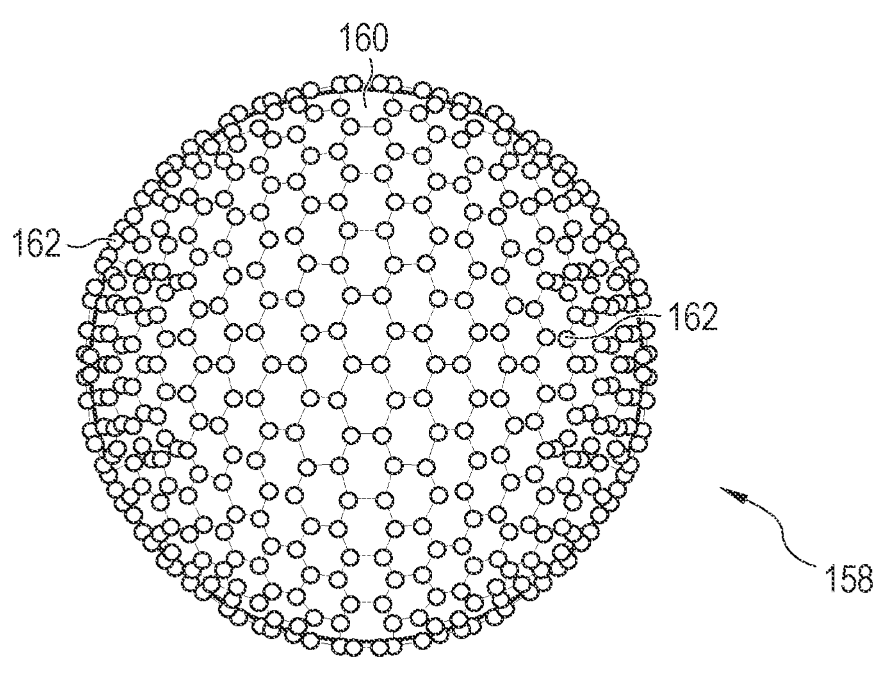
Figure 2I:
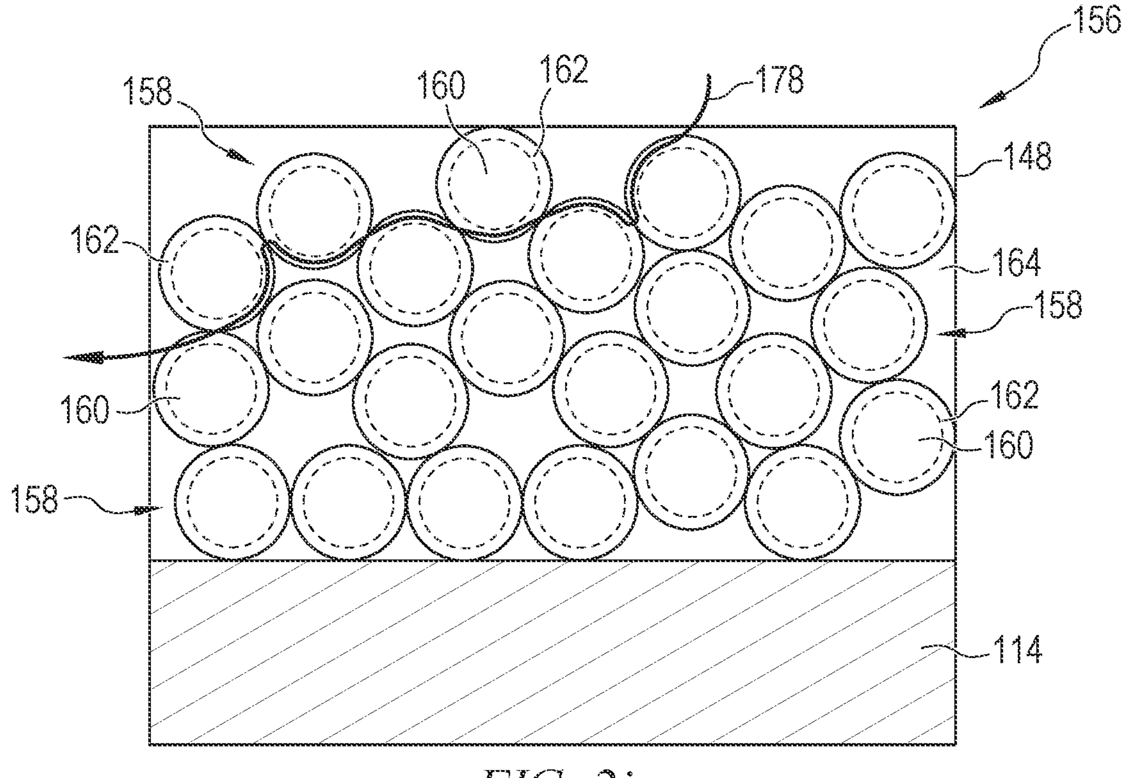
Figure 2J:
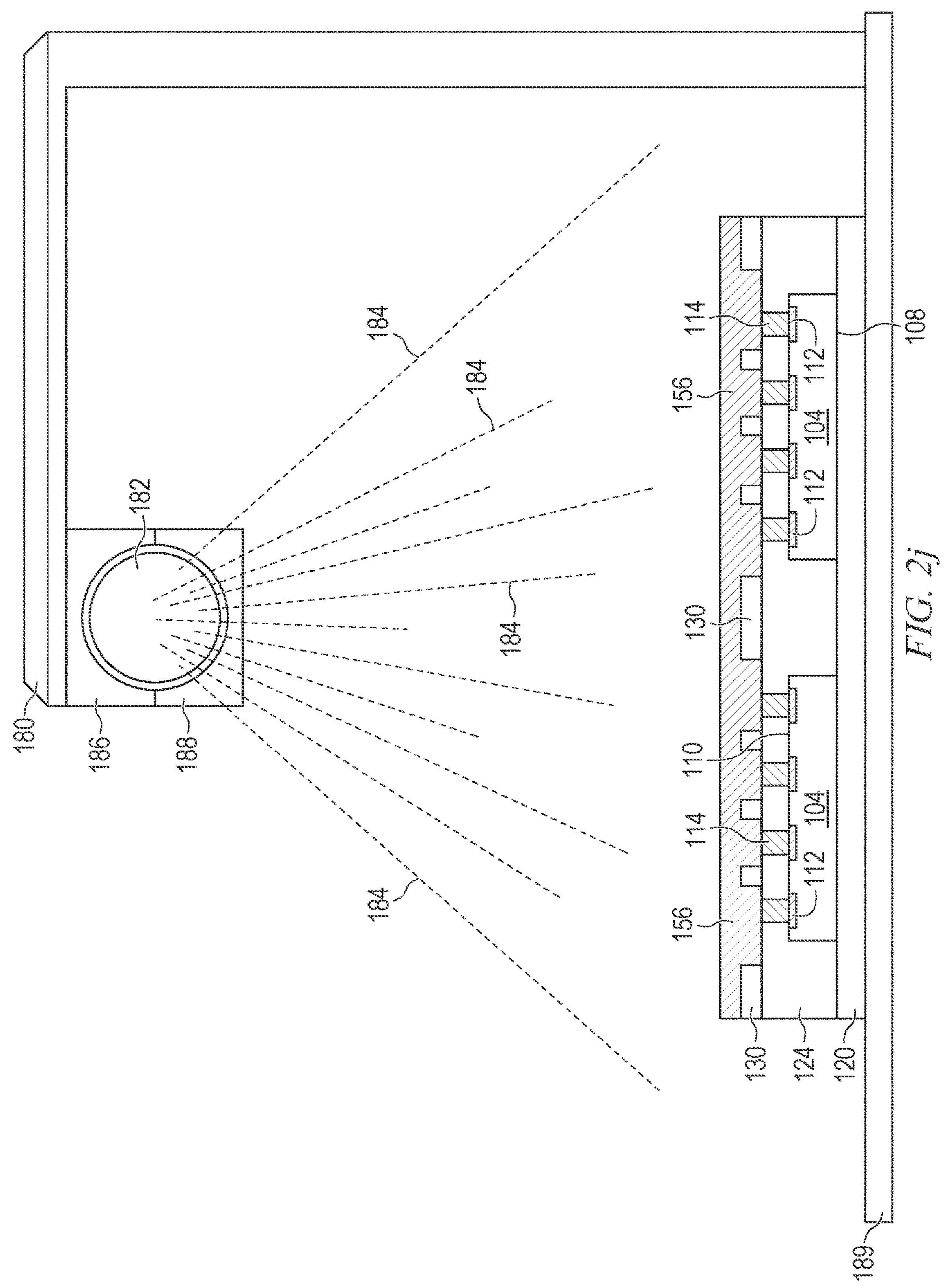
Figure 2K:
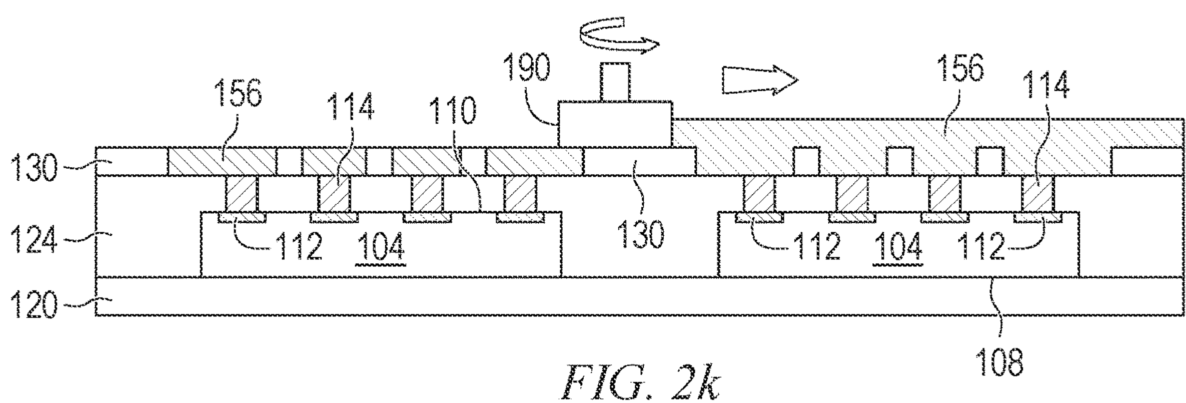
Figure 2L:
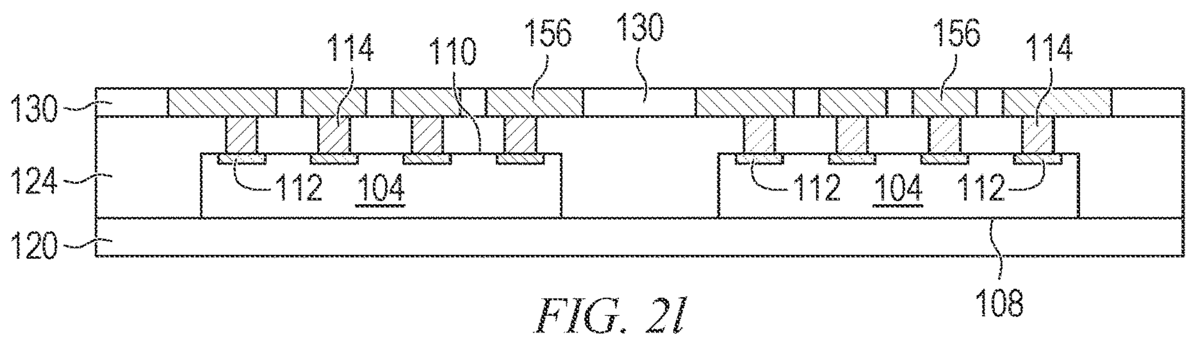
Figure 2M:
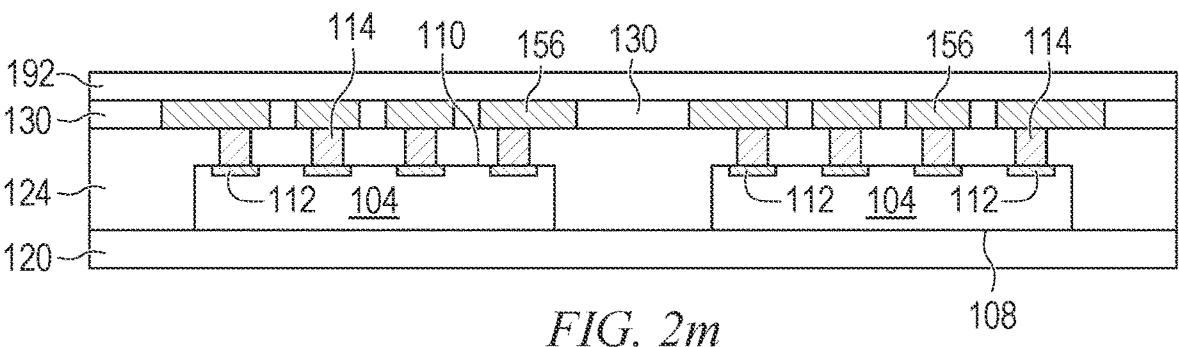
Figure 2N:
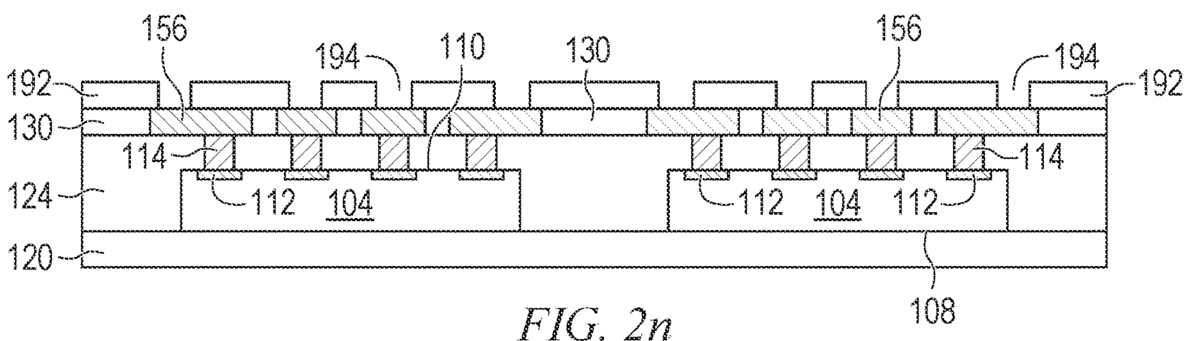
Figure 2O:
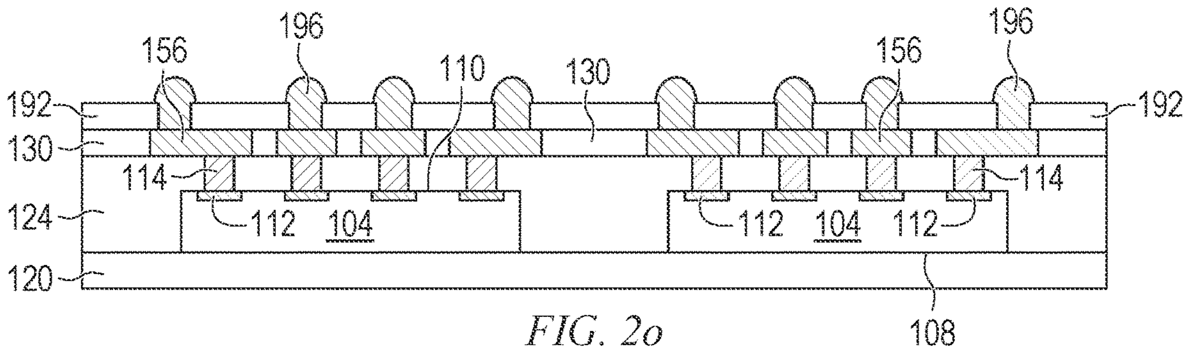
Figure 2P:
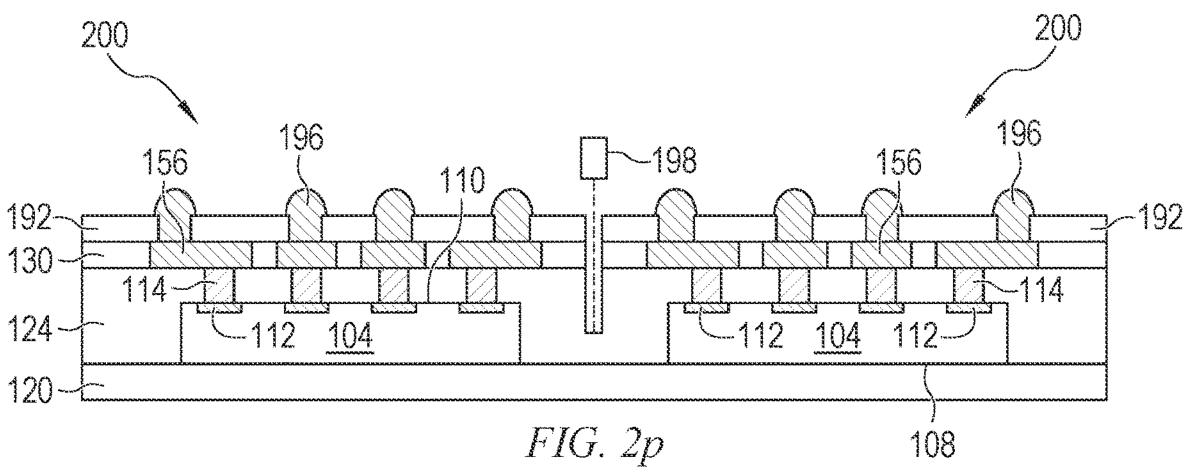
Figure 2Q:
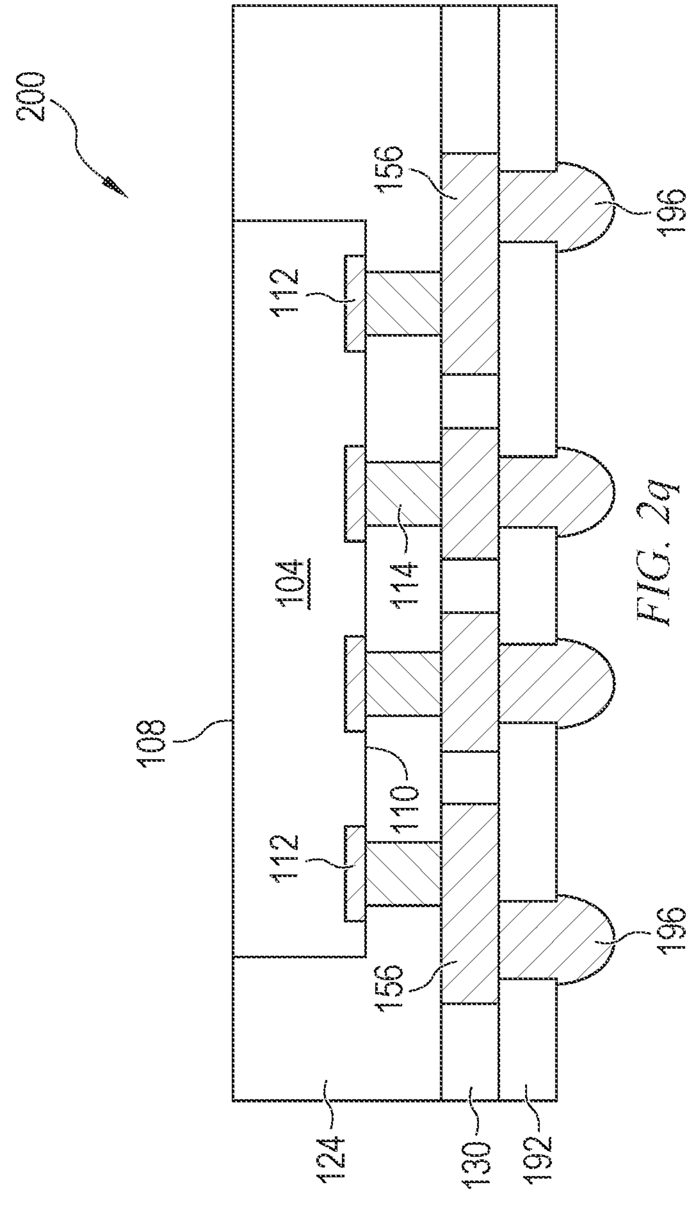

FIGS. 2*a*-2*q* illustrate a process of forming a face-up wafer-level package using intensive pulsed light irradiation. Semiconductor die 104 are picked and placed onto an adhesive carrier tape 120 in FIG. 2*a*. Any other electrical components can be disposed on carrier tape 120 in addition to or instead of semiconductor die 104. Semiconductor die 104 are disposed with back surfaces 108 disposed on carrier tape 120. In other embodiments, another type of carrier, e.g., glass, polymer, or silicon, is used instead of carrier tape 120. In some embodiments, a temporary bonding material such as thermal or UV release adhesive is used to adhere semiconductor die 104 to carrier tape 120 or the alternative carrier types. While a single carrier tape 120 suitable to form two semiconductor packages is shown, hundreds or thousands of units are commonly manufactured and processed on a single carrier before being singulated from each other using the same steps described herein performed en masse.

In FIG. 2*b*, encapsulant or molding compound 124 is deposited over and around carrier tape 120 and semiconductor die 104 using a paste printing, compressive molding, transfer molding, liquid encapsulant molding, vacuum lamination, spin coating, or another suitable applicator. Encapsulant 124 can be liquid or granular polymer composite material, such as epoxy resin, epoxy acrylate, or another suitable polymer, with or without a suitable filler. Encapsulant 124 is non-conductive, provides structural support, and environmentally protects the semiconductor device from external elements and contaminants.

In some embodiments, film-assisted molding or another molding technique is used to leave top surfaces of conductive pillars 114 exposed from or coplanar to a top surface of encapsulant 124. Alternatively, as shown in FIG. 2*c*, the top surface of encapsulant 124 can be backgrinded using a grinder 126 to remove a portion of the encapsulant and expose conductive pillars 114. Chemical-mechanical planarization (CMP) is used in some embodiments. FIG. 2*d* shows, in either case, the result with top surfaces of conductive pillars 114 exposed from and coplanar to a surface of encapsulant 124.

In FIG. 2*e*, an insulating layer 130 is formed over encapsulant 124 and semiconductor die 104. Insulating layer 130 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), FR-4 and other material having similar insulating and structural properties. Insulating layer 130 can be formed using PVD, CVD, printing, lamination, spin coating, spray coating, sintering, or thermal oxidation.

In FIG. 2*f*, openings 132 are formed through insulating layer 130 in the pattern of a redistribution layer (RDL), including being shaped as conductive traces fanning in or out from conductive pillars 114. Conductive pillars 114 are exposed within openings 132 to allow subsequent electrical interconnect to semiconductor die 104. Openings 132 are formed by chemical etching, laser ablation, or another suitable process.

In FIG. 2*g*, a conductive layer 156 is deposited over insulating layer 130 by aerosol jet printing a graphene-based conductive ink. In some embodiments, conductive layer 156 is printed only within the RDL pattern of openings 132. Overlapping openings 132 and completely covering insulating layer 130 as shown allows other deposition techniques to be used that require less precision. Conductive layer 156 physically and electrically contacts conductive pillars 114 through openings 132.

FIG. 2*h* illustrates detail of one of the graphene-coated metal balls 158 of conductive layer 156. Graphene-coated metal balls 158 are formed of a core 160 and a graphene shell or coating 162 formed on and around the core. In one embodiment, core 160 is Cu, Ag, Ni, phase change material (PCM), or other suitable metal or similar material. In some embodiments, a mix of some Cu cores 160 and some Ag cores 160 are used. FIG. 2*h* illustrates detail of graphene shell 162 formed as a mesh network around core 160. Graphene shell 162 is an allotrope of carbon with one or more layers of carbon atoms each arranged in a two-dimensional (2D) honeycomb lattice. Graphene shell 162 can be formed by CVD, wet chemical synthesis, or other suitable means. A plurality of graphene coatings 162 is formed on each core 160 in some embodiments.

For CVD, core 160 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene shell 162 on core 160. The release of carbon atoms over core 160 forms a continuous sheet of graphene shell 162. Additional information related to forming graphene coating 162 is disclosed in U.S. Pat. Nos. 8,535,553, 10,421,123, Korean Patent No. KR101465616, and Korean Patent No. KR101895114, which are all incorporated herein by reference.

FIG. 2*i* shows further detail of conductive layer 156 formed from a plurality of graphene-coated metal balls 158. In one embodiment, conductive layer 156 includes matrix 164 and a plurality of cores 160 with graphene coating 162 embedded within the matrix. In one embodiment, matrix 164 is a thermoset material, such as epoxy resin or adhesive with binder and filler containing alumina, Al, aluminum zinc oxide, or other material having good conductive properties. Matrix 164 can be thermal grease such as silicon or polymer type, e.g., polymethyl methacrylate (PMMA) or polyethylene terephthalate (PET). Matrix 164 can be epoxy, polyester, or acryl in other embodiments. In another embodiment, matrix 164 is a polymer or composite epoxy with dispersed graphene, carbon nanotubes, conductive polymers, and the like. Conductive layer 156 can be applied as an ink of graphene-coated metal balls 158 floating in matrix 164.

Each core 160, as embedded in matrix 164, is surrounded or covered by graphene coating or shell 162. In one embodiment, graphene shell 162 is a graphene paste or ink formed around a Cu or Ag core. In one embodiment, some cores 162 are formed from Cu while others are formed from Ag. Graphene coating 162 of each core 160 contacts the graphene coating of one or more adjacent cores. Cores 160 have sufficient density within matrix 164 that most if not all the graphene coatings around the cores contact at least one graphene coating around an adjacent core, and typically contact graphene coating of multiple adjacent cores.

Each graphene-coated metal ball 158 physically contacts adjacent graphene-coated metal balls within matrix 164 to create an electrically conductive path 178 including portions of interconnected graphene shells 162 on adjacent balls 158. The electrically conductive path 178 is the primary current carrier for conductive traces of conductive layer 156. The electrical charges flowing through many electrically conductive paths like 178 in balls 158 operate to carry electrical signals across substrate 120.

To ensure establishment of conductive paths 178 between all adjacent balls 158, conductive layer 156 is sintered as shown in FIG. 2*j*. Sintering is performed using an IPL device 180. IPL device 180 includes a xenon flashlamp 182 that emits light rays 184. Reflector 186 reflects light rays 184 to increase the amount of light emitted downward toward conductive layer 156. An optional ultraviolet filter 188 filters light rays 184. Platform 189 holds the devices being processed.

IPL uses intense pulses of non-coherent light emitted over a range of wavelengths. In one embodiment, the IPL wavelength extends from approximately 350 nanometers (nm) to 1200 nm. The lower end of the wavelength spectrum is 400 nm in other embodiments. Xenon flashlamp 182 produces high output bursts of broad-spectrum light 184. Light 184 hitting matrix 164 with balls 158 sinters conductive layer 156 to solidify the material and electrical connections between the balls. Sintering conductive layer 156 with IPL irradiation can be completed in between several milliseconds and several seconds, whereas traditional conductive layers in the prior art require a thermal heating process typically taking between 30 and 90 minutes. IPL has a higher peak power output and a shorter pulse duration compared to UV light, which enables more energy to be delivered in a shorter time than the UV light commonly used in the prior art.

In some embodiments, the panel of devices with conductive layer 156 is placed into an oven for pre-processing before IPL irradiation. The oven temperature is set to between 170° C. and 280° C., and conductive layer 156 is heated for between 30 seconds and two minutes. In one embodiment, conductive layer 156 is heated at 250° C. for one minute. The oven pre-processing removes organic solvent from conductive layer 156. In some embodiments, the panel is placed into an oven for post-processing after IPL irradiation. The oven temperature for post-processing is between 90° C. and 120° C. for a length of time between five and ten minutes. Post-processing in the oven stabilizes the sintered material.

Forming conductive layer 156 with sintering done by IPL irradiation increases the number of units per hour (UPH) that can be manufactured, thus reducing manufacturing costs. Moreover, graphene has ten times the electrical conductivity of copper or silver by themselves so conductive layer 156 has an increased current carrying capability compared to the prior art. Graphene coating 162 increases thermal conductivity and hardness of conductive layer 156. Graphene coating 162 also reduces metal oxidation and ion migration, thus increasing the mean time between failures.

In FIG. 2*k*, conductive layer 156 is backgrinded using a grinder 190 or another suitable means to remove portions of the conductive layer that extended outside of openings 132 and onto the top surface of insulating layer 130. CMP is used in some embodiments. The remaining portions of conductive layer 156 are completely within and match the RDL pattern of openings 132. Individual conductive traces of conductive layer 156 are physically and electrically separated from each other after backgrinding to allow the conductive layer to operate as a fan-out or fan-in interconnect structure. In embodiments where conductive layer 156 is only printed within openings 132, no backgrinding is necessary. FIG. 2*l* shows conductive layer 156 after backgrinding, or after IPL if no backgrinding is necessary.

In FIG. 2*m*, an insulating layer 192 is formed over insulating layer 130 and conductive layer 156 as described above for insulating layer 130. Openings 194 are formed through insulating layer 192 in FIG. 2*n* as described above for openings 132. Openings 194 are formed as vias at opposite ends of conductive traces of conductive layer 156 from conductive pillars 114, rather than forming an RDL pattern as with openings 132.

In FIG. 2*o*, an electrically conductive bump material is deposited in openings 194 over conductive layer 156 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is optionally bonded to conductive layer 156 using a suitable attachment or bonding process. In one embodiment, the bump material is reflowed by heating the material above its melting point to form balls or bumps 196.

Conductive layer 156 formed with graphene-coated metal balls 158 has good solder wettability, unlike copper and other common metal conductive traces, so bumps 196 can be formed directly on conductive layer 156. In other embodiments, bumps 196 are formed over an under-bump metallization (UBM) having a wetting layer, barrier layer, and adhesion layer. Bump 196 can also be compression bonded or thermocompression bonded to conductive layer 156. Bump 156 represents one type of interconnect structure that can be formed over conductive layer 156. The interconnect structure can also use bond wires, conductive paste, stud bump, micro bump, or other electrical interconnect. Conductive layer 156 provides fan-in or fan-out interconnect from conductive pillars 114 to bumps 196.

In FIG. 2*p*, the panel is singulated between units using a saw blade or laser cutting tool 198 to separate the panel into individual semiconductor packages 200. Semiconductor packages 200 are picked and placed off of carrier tape 120 to produce a final package as shown in FIG. 2*q*. In some embodiments, carrier tape 120 is singulated with and remains on packages 200 as a protective layer over back surface 108 of semiconductor die 104.

Semiconductor package 200 is a face-up wafer-level package with conductive layer 156 operating as a redistribution layer sintered by IPL irradiation. Contact pads 112 of semiconductor die 104 are electrically coupled to solder bumps 196 through conductive layer 156. Conductive layer 156 is formed from graphene-coated conductive balls 158.

Graphene coating 162 increases electrical and thermal conductivity, hardness, and oxidation stability and decreases the amount of ion migration that will occur during the lifetime of semiconductor package 200. IPL irradiation of conductive layer 156 increases the units per hour (UPH) that can be manufactured compared to the prior art by reducing the time required for each unit.

Figure 3A:
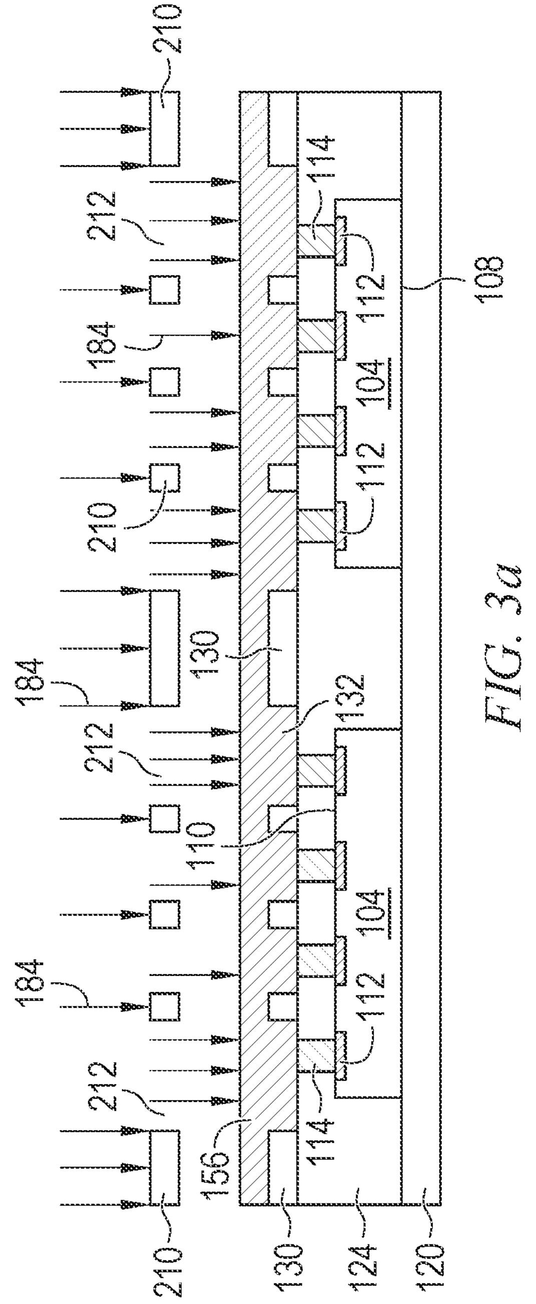
FIGS. 3*a* and 3*b* illustrate using a mask during intensive pulsed light irradiation.
Figure 3B:
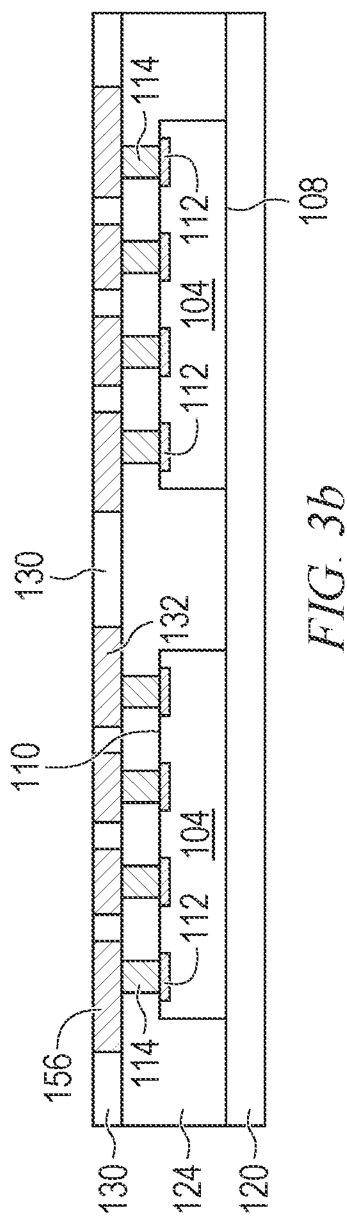

FIGS. 3*a* and 3*b*, continuing from FIG. 2*g*, illustrate using a mask 210 for IPL irradiation. Mask 210 includes openings 212 that are aligned to and disposed directly over openings 132 of insulating layer 130. Openings 212 in mask 210 form an RDL pattern matching the RDL pattern of openings 132 in insulating layer 130. Openings 212 are the same, or approximately the same, size and shape as openings 132. Light rays 184 from IPL device 180 go through openings 212 to hit portions of conductive layer 156 within openings 132. Light rays 184 in other areas hit mask 210 instead of conductive layer 156, thereby preventing the conductive layer from hardening outside of openings 132. The undesired portions of conductive layer 156 can be more easily removed because they were not sintered by IPL irradiation. FIG. 3*b* shows the undesired portions of conductive layer 156, i.e., the portions of the conductive layer outside of openings 132, having been removed. Manufacturing continues as shown in FIGS. 2*m*-2*q*. Any of the above or below described embodiments can have IPL irradiation performed with or without mask 210.

Figure 4A:
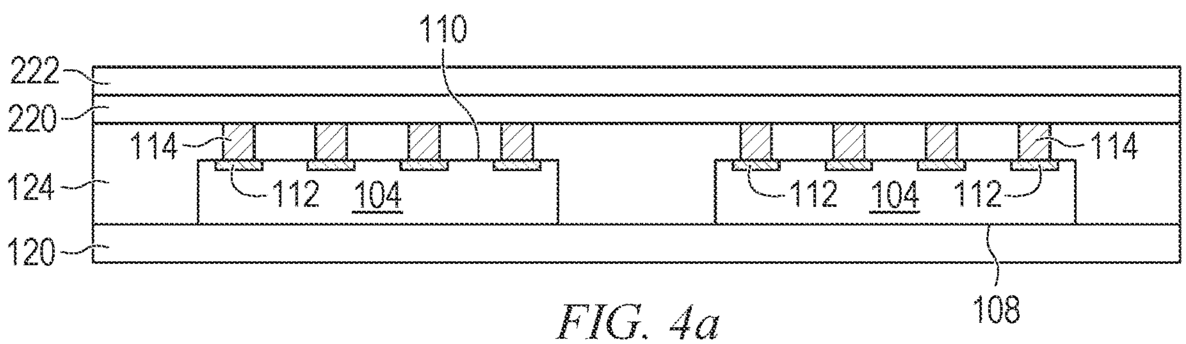
FIGS. 4*a*-4*e* illustrate a multi-layer RDL embodiment.

FIGS. 4*a*-4*e* illustrate an embodiment with insulating layer 130 replaced by a pair of insulating layers 220 and 222. FIG. 4*a* shows insulating layers 220 and 222 formed over encapsulant 124 and semiconductor die 104. Each individual insulating layer 220 and 222 is formed in a similar manner and of similar materials as described above for insulating layer 130. Insulating layer 220 is formed first, and then insulating layer 222 is formed over insulating layer 220.

Figure 4B:
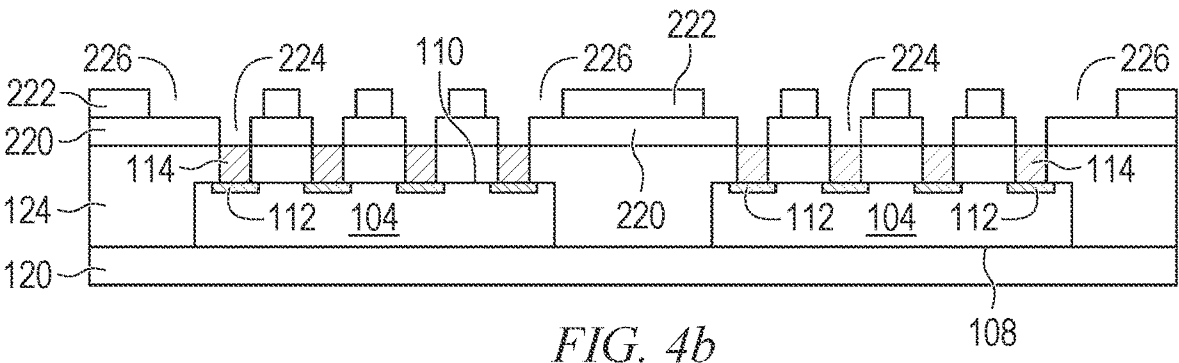

In FIG. 4*b*, openings 224 are formed through insulating layer 220 and openings 226 are formed through insulating layer 222. Openings 224 and 226 are formed by chemical etching, laser ablation, or another suitable process. In one embodiment, a first etching process forms openings 226 and then a second etching process forms openings 224 within openings 226. Openings 224 form vias to expose conductive pillars 114. Each opening 224 has approximately the same footprint size and shape as a corresponding conductive pillar 114. Openings 226 are formed in an RDL pattern, similar to openings 132, including conductive traces fanning in or out from conductive pillars 114.

Figure 4C:
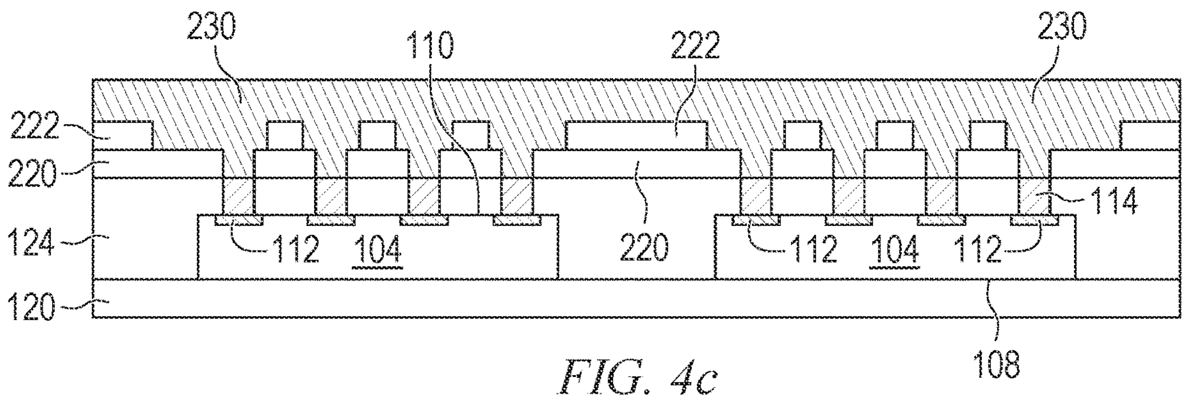
Figures 4D, 4E:
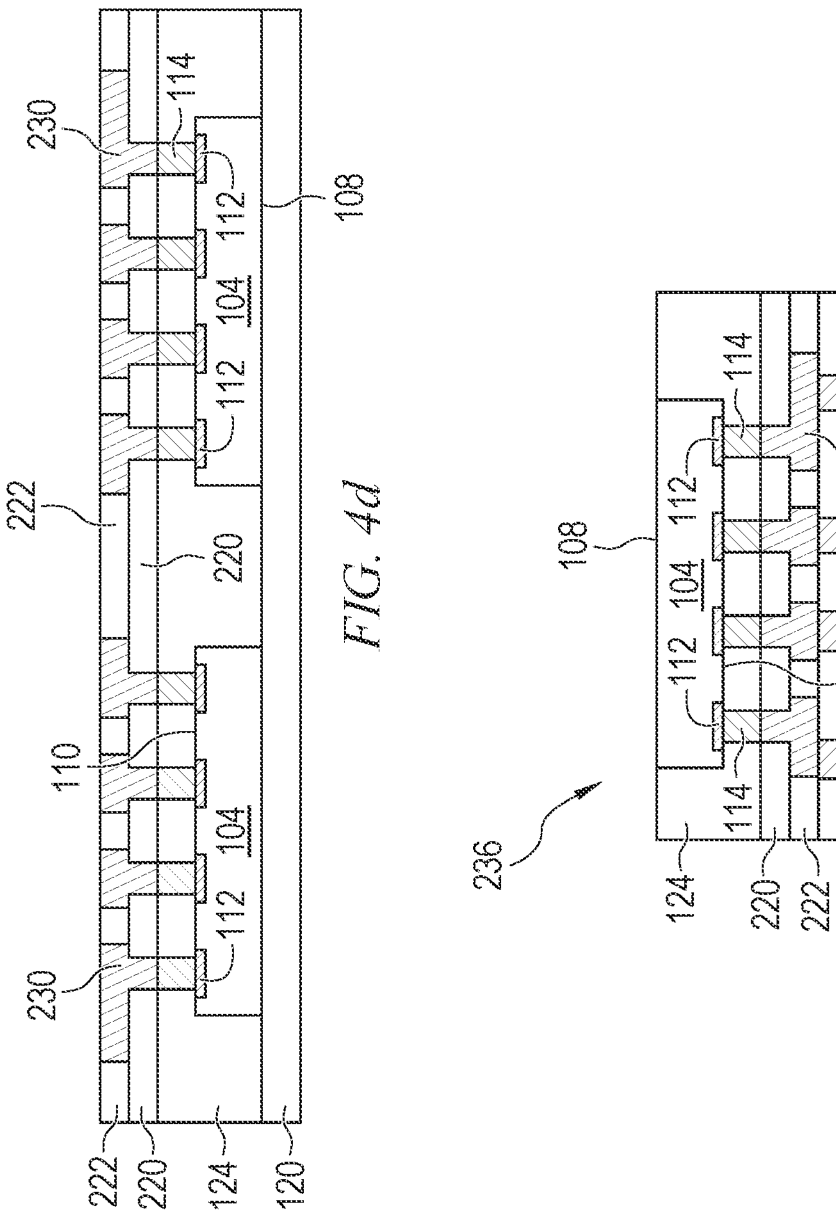

Conductive layer 230 is formed over insulating layers 220 and 222 and extending into openings 224 and 226 in FIG. 4*c*. Conductive layer 230 is formed of graphene-coated metal balls 158 as above with conductive layer 156. Conductive layer 230 is IPL sintered, with or without mask 210, and then any portion of conductive layer 230 above the top surface of insulating layer 222 is removed as shown in FIG. 4*d*. Package 236 is finished by forming insulating layer 192 and solder bumps 196, then singulating as shown in FIG. 4*e*.

Figure 5A:
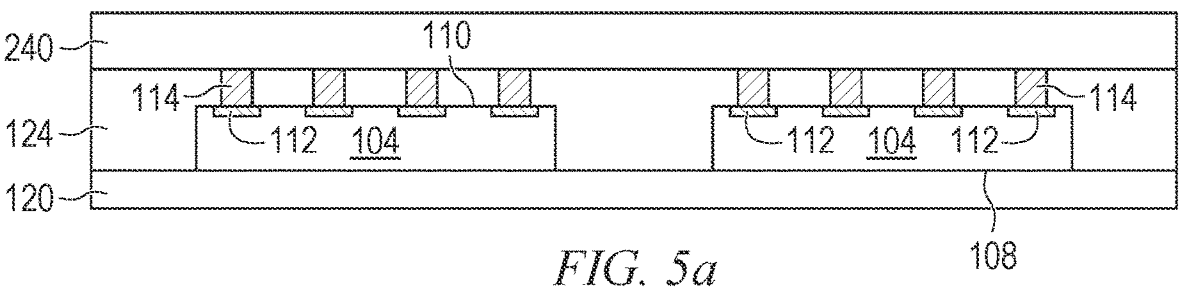
FIGS. 5*a*-5*c* illustrate a double-thickness insulating layer embodiment.
Figure 5B:
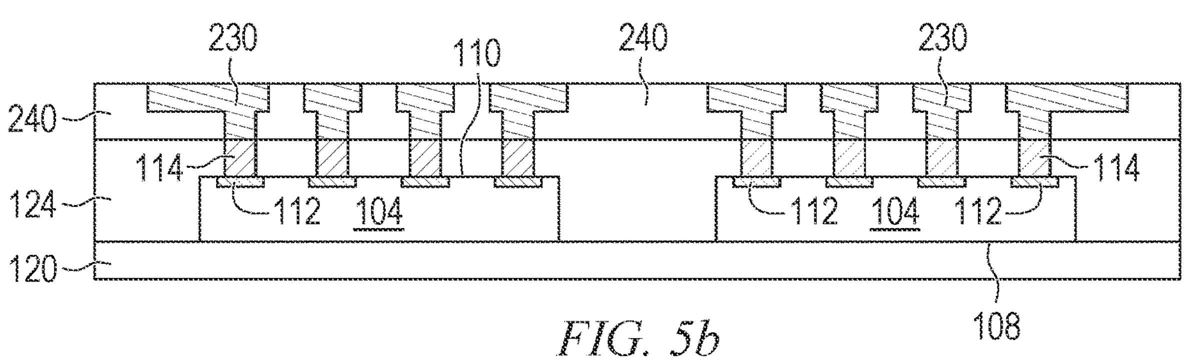
Figure 5C:
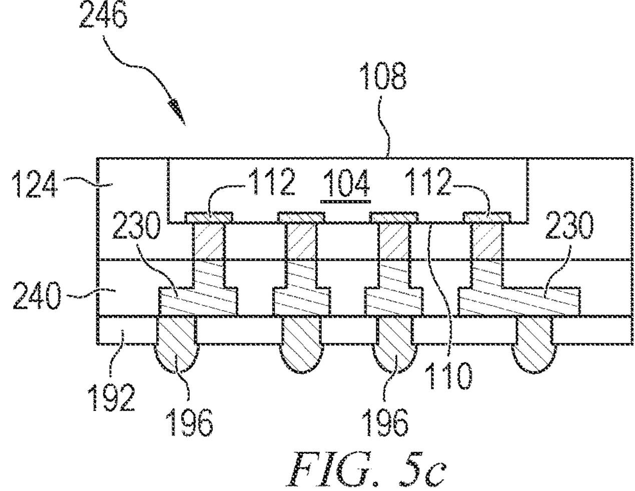

FIGS. 5*a*-5*c* illustrate a similar embodiment with a double-thick insulating layer 240 formed instead of insulating layer 130. Openings 224 and 226 are formed as shown in FIG. 4*b*, but through a single insulating layer 240 instead of a double insulating layer 220-222. Conductive layer 230 is formed as described above. Insulating layer 192 and solder bumps 196 are formed, followed by singulation, to complete a semiconductor package 246 as shown in FIG. 5*c*.

Figure 6A:
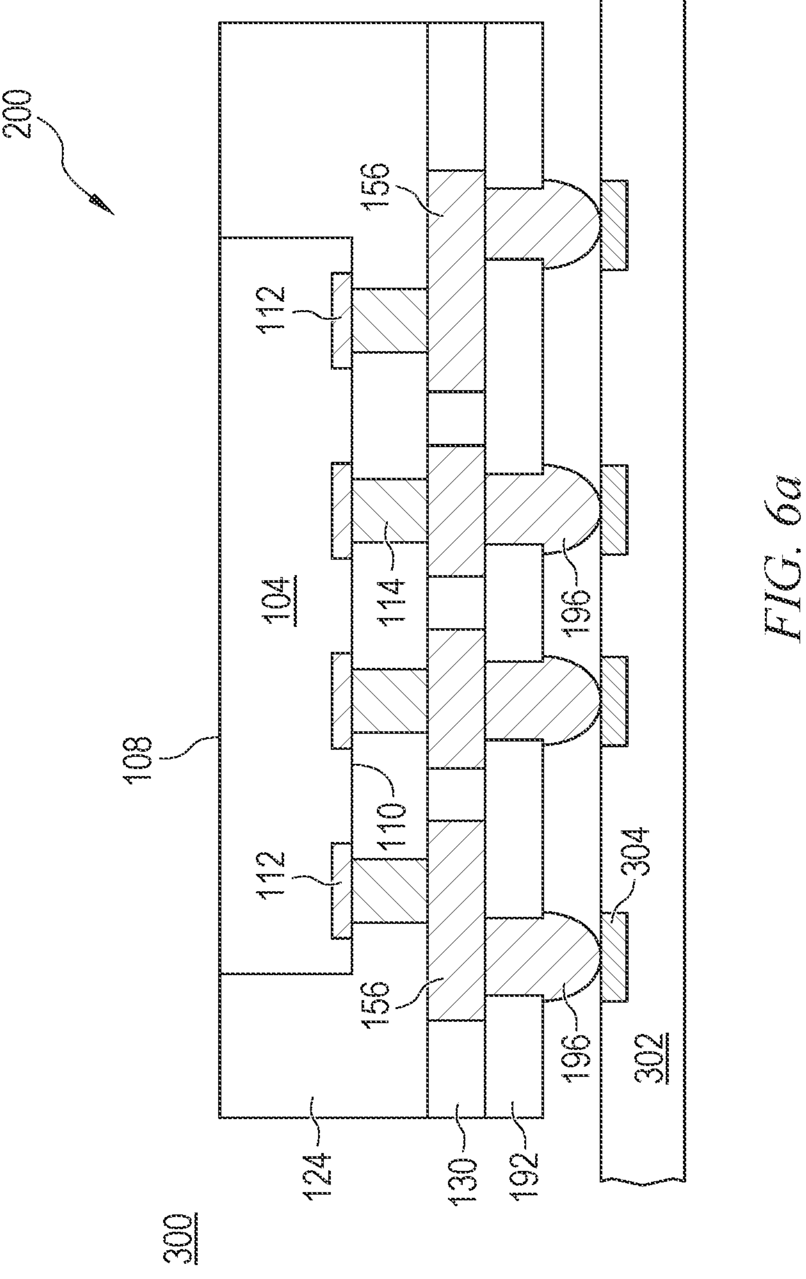
FIGS. 6*a* and 6*b* illustrate integrating the semiconductor packages into an electronic device.
Figure 6B:
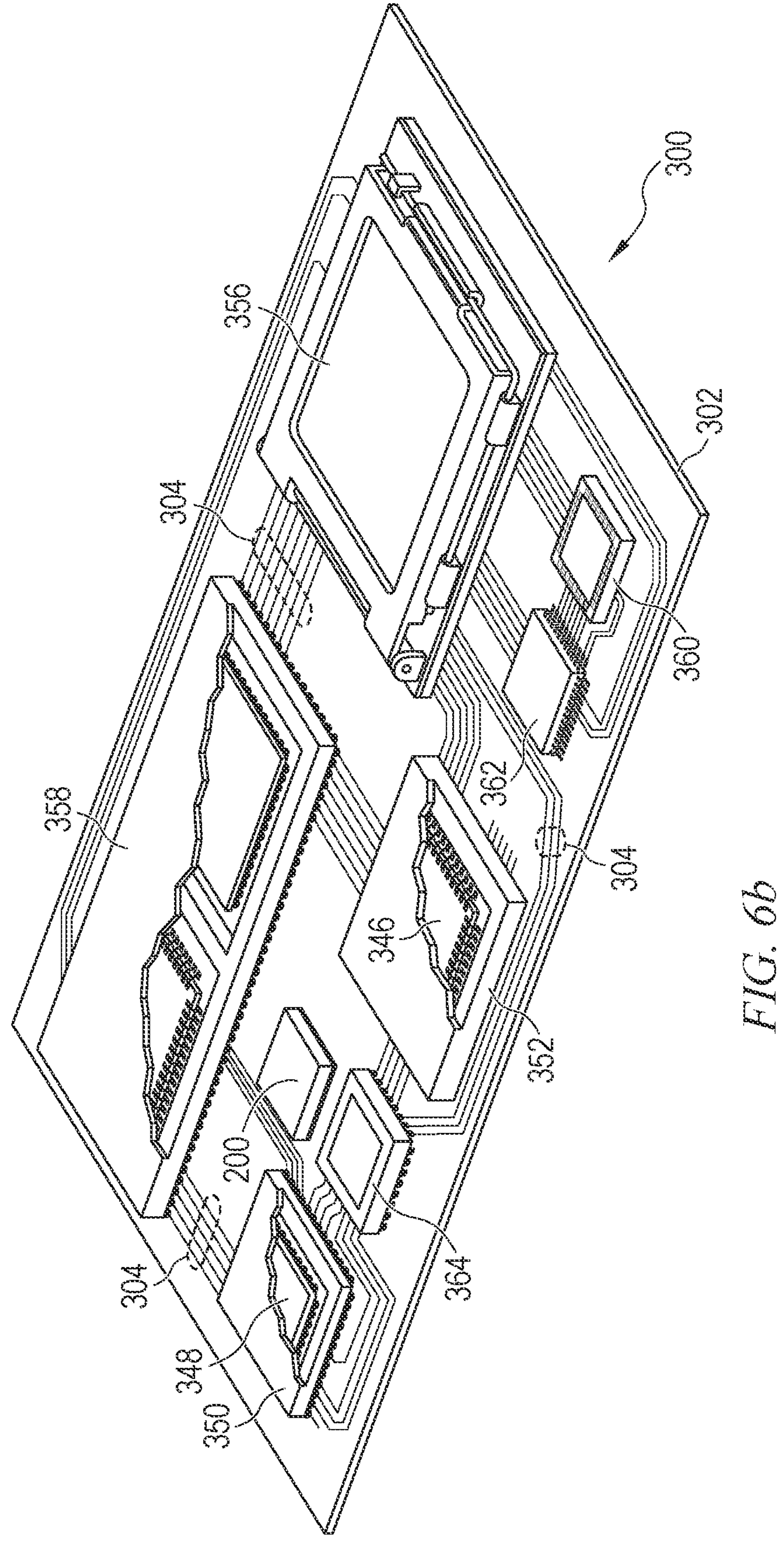

FIGS. 6*a* and 6*b* illustrate integrating the above-described semiconductor packages, e.g., semiconductor package 200, into a larger electronic device 300. FIG. 6*a* illustrates a partial cross-section of semiconductor package 200 mounted onto a printed circuit board (PCB) or other substrate 302 as part of electronic device 300. Bumps 196 are reflowed onto conductive layer 304 of PCB 302 to physically attach and electrically connect semiconductor package 200 to the PCB. In other embodiments, thermocompression or another suitable attachment and connection methods are used. In some embodiments, an adhesive or underfill layer is used between semiconductor package 200 and PCB 302. Semiconductor die 104 is electrically coupled to conductive layer 304 through bumps 196 and conductive layer 156.

FIG. 6*b* illustrates electronic device 300 having a chip carrier substrate or PCB 302 with a plurality of semiconductor packages disposed on a surface of PCB 302, including semiconductor package 200. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASICs, logic circuits, analog circuits, RF circuits, discrete devices, or other semiconductor die or electrical components. Miniaturization and weight reduction are essential for the products to be accepted by the market. The distance between semiconductor devices may be decreased to achieve higher density. PCB 302 may have a more irregular shape to fit conveniently into more ergonomic and smaller device shells.

In FIG. 6*b*, PCB 302 provides a general substrate for structural support and electrical interconnect of the semiconductor packages disposed on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) or SIP module 358, quad flat non-leaded package (QFN) 360, quad flat package 362, and embedded wafer level ball grid array (eWLB) 364 are shown disposed on PCB 302. In one embodiment, eWLB 364 is a fan-out wafer level package (Fo-WLP) or a fan-in wafer level package (Fi-WLP).

Depending upon the system requirements, any combination of semiconductor packages, configured with any combination of first and second level packaging styles, as well as other electrical components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a carrier;

disposing an electrical component over the carrier, wherein the electrical component includes a plurality of conductive pillars oriented away from the carrier;

depositing an encapsulant over the electrical component, wherein the encapsulant extends to physically contact side surfaces of the electrical component and each of the conductive pillars;

forming a conductive layer over the encapsulant, wherein the conductive layer is deposited as a plurality of graphene-coated metal balls embedded in a matrix, wherein the conductive layer extends continuously across an entire width of the electrical component and physically contacts each of the conductive pillars, and wherein the graphene-coated metal balls are each interconnected as one graphene-coated metal ball of the plurality of graphene-coated metal balls physically contacts another graphene-coated metal ball of the plurality of graphene-coated metal balls within the conductive layer to form a continuous conduction path through the graphene-coated metal balls between the conductive pillars;

sintering the conductive layer by intensive pulsed light (IPL) irradiation; and backgrinding the conductive layer to leave a redistribution layer (RDL) pattern after sintering.

2. The method of claim 1, wherein the plurality of graphene-coated metal balls comprises a plurality of cores formed from copper or silver, and each of the plurality of cores includes a graphene coating.

3. The method of claim 1, further including:

forming a first insulating layer over the encapsulant;

etching the RDL pattern into the first insulating layer; and forming the conductive layer in the RDL pattern.

4. The method of claim 3, further including:

forming a second insulating layer over the conductive layer;

forming an opening through the second insulating layer to expose the conductive layer; and forming a solder bump in the opening on the conductive layer.

5. The method of claim 3, further including:

forming a second insulating layer between the encapsulant and first insulating layer;

forming a via in the second insulating layer; and forming the RDL pattern over the via.

6. The method of claim 3, further including forming a via in the first insulating layer under the RDL pattern.

7. A method of making a semiconductor device, comprising:

providing an electrical component;

depositing an encapsulant over the electrical component;

forming a conductive layer over the encapsulant, wherein the conductive layer is deposited as a plurality of graphene-coated metal balls embedded in a matrix, wherein the conductive layer extends continuously across an entire width of the electrical component, and wherein the graphene-coated metal balls are each interconnected as one graphene-coated metal ball of the plurality of graphene-coated metal balls physically contacts another graphene-coated metal ball of the plurality of graphene-coated metal balls within the conductive layer to form a continuous conduction path through the conductive layer; and sintering the conductive layer by intensive pulsed light (IPL) irradiation.

8. The method of claim 7, further including disposing a mask over the encapsulant during sintering.

9. The method of claim 7, further including:

forming a first insulating layer over the encapsulant;

etching an RDL pattern into the first insulating layer; and forming the conductive layer in the RDL pattern.

10. The method of claim 9, further including:

forming a second insulating layer over the conductive layer;

forming an opening through the second insulating layer to expose the conductive layer; and forming a solder bump in the opening on the conductive layer.

11. The method of claim 9, further including:

forming a second insulating layer between the encapsulant and first insulating layer;

forming a via in the second insulating layer; and forming the RDL pattern over the via.

12. The method of claim 9, further including forming a via in the first insulating layer under the RDL pattern.

13. A method of making a semiconductor device, comprising:

providing a carrier;

disposing an electrical component over the carrier;

depositing an encapsulant over the electrical component;

forming a conductive layer over the encapsulant, wherein the conductive layer is deposited as a plurality of graphene-coated metal balls embedded in a matrix, wherein the conductive layer extends continuously across an entire width of the electrical component, and wherein the graphene-coated metal balls are each interconnected as one graphene-coated metal ball of the plurality of graphene-coated metal balls physically contacts another graphene-coated metal ball of the plurality of graphene-coated metal balls within the conductive layer to form a continuous conduction path through the conductive layer;

disposing an intensive pulsed light (IPL) device over the conductive layer; and sintering the conductive layer using the IPL device.

14. The method of claim 13, wherein the plurality of graphene-coated metal balls comprises a plurality of cores formed from copper or silver, and each of the plurality of cores includes a graphene coating.

15. The method of claim 13, further including:
forming a first insulating layer over the encapsulant;
etching an RDL pattern into the first insulating layer; and
forming the conductive layer in the RDL pattern.

16. The method of claim 15, further including:
forming a second insulating layer over the conductive layer;
forming an opening through the second insulating layer to expose the conductive layer; and
disposing a solder bump in the opening on the conductive layer.

17. The method of claim 15, further including:
disposing a second insulating layer between the encapsulant and first insulating layer; and
forming a via in the second insulating layer under the RDL pattern.

18. The method of claim 15, further including a forming via in the first insulating layer under the RDL pattern.

19. A method of making a semiconductor device, comprising:
providing an electrical component;
depositing an encapsulant over the electrical component; and
forming a conductive layer over the encapsulant, wherein the conductive layer includes a plurality of graphene-coated metal balls embedded in a matrix, and wherein the conductive layer extends continuously across an entire width of the electrical component, and wherein the graphene-coated metal balls are each interconnected as one graphene-coated metal ball of the plurality of graphene-coated metal balls physically contacts another graphene-coated metal ball of the plurality of graphene-coated metal balls within the conductive layer to form a continuous conduction path through the conductive layer.

20. The method of claim 19, further including disposing a mask over the encapsulant.

21. The method of claim 19, further including:
forming a first insulating layer over the encapsulant;
etching an RDL pattern into the first insulating layer; and
forming the conductive layer in the RDL pattern.

22. The method of claim 21, further including:
forming a second insulating layer over the conductive layer;
forming an opening through the second insulating layer to expose the conductive layer; and
forming a solder bump in the opening on the conductive layer.

23. The method of claim 21, further including:
forming a second insulating layer between the encapsulant and first insulating layer; and
forming a via in the second insulating layer under the RDL pattern.

24. The method of claim 21, further including forming a via in the first insulating layer under the RDL pattern.

* * * * *